United States Patent
Hu et al.

(10) Patent No.: US 10,278,307 B2
(45) Date of Patent: Apr. 30, 2019

(54) COOLING PLATE AND METHOD FOR MANUFACTURING THEREOF

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Xian-Qin Hu, Shenzhen (CN); Fu-Yun Shen, Shenzhen (CN); Ming-Jaan Ho, Tu-Cheng (TW); Hsiao-Ting Hsu, Tu-Cheng (TW)

(73) Assignees: Avary Holding (Shenzhen) Co., Limited, Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 15/823,384

(22) Filed: Nov. 27, 2017

(65) Prior Publication Data

US 2019/0059174 A1    Feb. 21, 2019

(30) Foreign Application Priority Data

Aug. 16, 2017  (CN) .......................... 2017 1 0704429

(51) Int. Cl.
| H05K 7/20 | (2006.01) |
| H01L 23/473 | (2006.01) |
| G06F 1/20 | (2006.01) |

(52) U.S. Cl.
CPC .......... *H05K 7/2029* (2013.01); *G06F 1/203* (2013.01); *H01L 23/473* (2013.01); *G06F 2200/201* (2013.01)

(58) Field of Classification Search
CPC .... G06F 1/203; G06F 2200/201; F28D 15/02; F28D 15/0233; F28D 15/0283;
(Continued)

(56) References Cited

U.S. PATENT DOCUMENTS

| 3,453,839 A | 7/1969 | Sabin |
| 5,317,805 A * | 6/1994 | Hoopman ............... B23P 15/26 |
| | | 257/E23.098 |

(Continued)

FOREIGN PATENT DOCUMENTS

TW    201723408 A    7/2017

*Primary Examiner* — Dion Ferguson
*Assistant Examiner* — Amir A Jalali
(74) *Attorney, Agent, or Firm* — ScienBiziP, P.C.

(57) ABSTRACT

A cooling plate of a first embodiment of the present disclosure is configured with a electronic device for heat dissipation. The cooling plate of the first embodiment disclosure includes a first plate, a second plate opposite to the first plate, a bonding line connected with the first plate and the second plate, a plurality of supporting columns, and a cooling liquid received between the first plate and the second plate. The first plate, the second plate, and the bonding line together define a cavity, the plurality of supporting columns and the cooling liquid are received in the cavity. The plurality of supporting columns connects perpendicularly with the first plate and the second plate. The cooling liquid communicates between the plurality of the supporting columns.

10 Claims, 7 Drawing Sheets

(58) Field of Classification Search
CPC .... F28F 21/085; F28F 3/048; F28F 2275/025; B32B 7/12; B32B 3/30; B32B 15/01; H01L 23/473; H01L 23/427; H05K 1/0203; H05K 7/2029; H05K 7/20309–7/20318; H05K 7/2039
USPC .............. 361/700, 718–719; 165/80.4–80.5, 165/104.21, 104.33; 257/715
See application file for complete search history.

(56) References Cited

U.S. PATENT DOCUMENTS

| | | | | |
|---|---|---|---|---|
| 6,337,471 | B1* | 1/2002 | Kistner | B21D 26/055 219/633 |
| 6,899,165 | B1* | 5/2005 | Wu | F28D 15/0233 165/104.21 |
| 7,246,655 | B2* | 7/2007 | Mochizuki | F28D 15/046 165/104.21 |
| 9,968,965 | B2* | 5/2018 | Iwamoto | B05D 5/08 |
| 2006/0090882 | A1* | 5/2006 | Sauciuc | F28D 15/0233 165/104.26 |
| 2008/0116568 | A1* | 5/2008 | Laquer | H01L 23/44 257/712 |
| 2013/0056178 | A1* | 3/2013 | Matsunaga | F28D 15/0233 165/104.21 |
| 2015/0101785 | A1* | 4/2015 | Ho | F28F 21/085 165/170 |
| 2015/0192368 | A1* | 7/2015 | Shedd | F25B 41/00 165/96 |
| 2016/0061540 | A1* | 3/2016 | Hu | F28F 21/085 165/104.19 |
| 2016/0066472 | A1* | 3/2016 | Cader | G06F 1/206 361/699 |
| 2016/0320142 | A1* | 11/2016 | Ho | B32B 3/30 |
| 2017/0325356 | A1* | 11/2017 | Hou | H05K 7/2039 |

* cited by examiner

COOLING PLATE AND METHOD FOR MANUFACTURING THEREOF

CROSS-REFERENCE TO RELATED APPLICATIONS

This application claims priority to Chinese Patent Application No. 201710704429.2 filed on Aug. 16, 2017, the contents of which are incorporated by reference herein.

FIELD

The subject matter herein generally relates to a cooling plate and method for manufacturing thereof.

BACKGROUND

The development of electronic devices, such as cell phones and tablet personal computers (PCs), strives to achieve diverse functionalities and better performances.

To achieve diverse functionalities and performances require powerful CPUs and/or highly integrated circuit designs. However, while the more powerful the CPU and the more components integrated in the circuit design, the more heat will be generated. So, the electronic devices with powerful CPU and highly integrated circuits need better heat dissipation

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
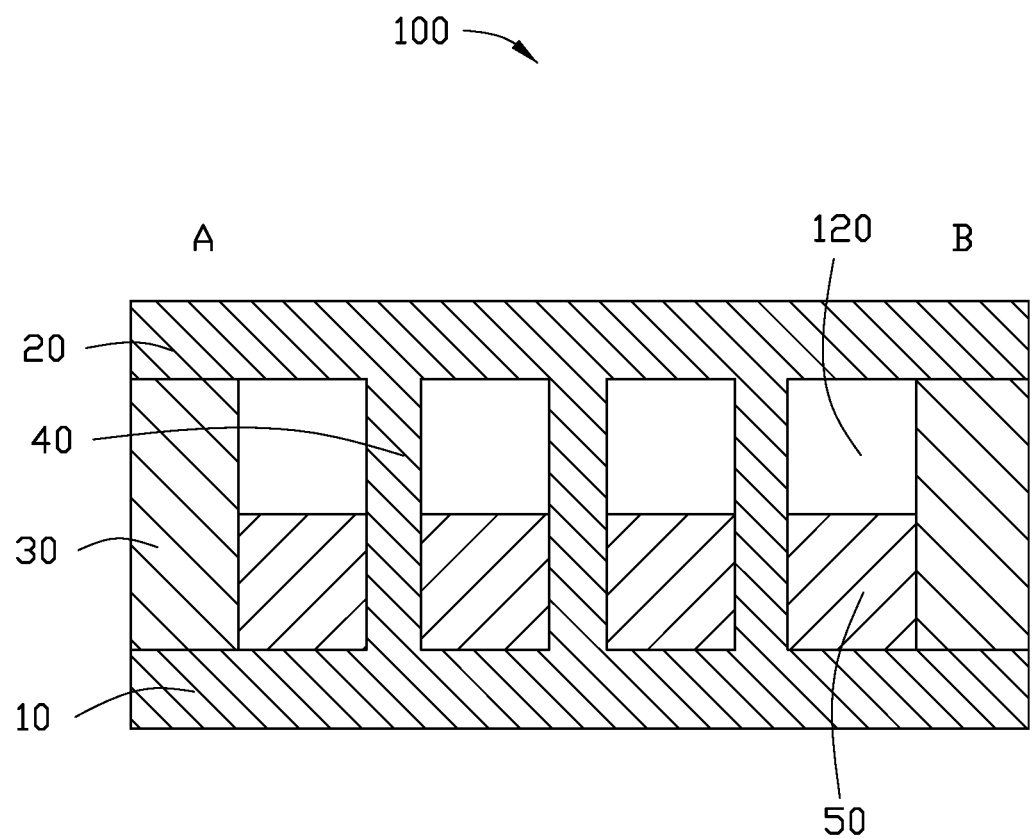
FIG. 1 is a cross-sectional view of a cooling plate of a first embodiment of the present disclosure.

Referring to FIG. 1, a cooling plate 100 of a first embodiment of the present disclosure is configured with an electronic device for heat dissipation.

The cooling plate 100 of the first embodiment disclosure includes a first plate 10, a second plate 20 opposite to the first plate 10, a bonding line 30 between the first plate 10 and the second plate 20, a plurality of supporting columns 40 and cooling liquid 50 received between the first plate 10 and the second plate 20. The cooling liquid 50 can be Methyl Nonafluorobutyl Ether ($C_4F_9OCH_3$) or Ethyl Nonafluorobutyl Ether ($C_4F_9OC_2H_5$).

The cooling plate 100 has a first end A and a second end B. In the exemplary embodiment, the first end A is an evaporation portion. The second end B is a condensation portion. The cooling liquid 50 can be evaporated in the first end A and can be condensate in the second end B of the cooling plate 100.

The first plate 10 and the second plate 20 are made of copper. The bonding line 30 is mounted on peripheries of the first plate 10 and connects the first plate 10 and the second plate 20. Further, the first plate 10, the second plate 20 and the bonding line 30 together define a cavity 120. A cooling liquid 50 is received in the cavity 120, and the cavity 120 separated by the supporting columns 40 is in air communication with one another.

Surfaces of the first plate 10 and surfaces of the second plate 20 within the cavity 120 have not been mounted a wick structure thereon.

The plurality of the supporting columns 40 respectively extends from the first plate 10 to the second plate 20.

The vaporization heat of the cooling liquid 50 is between 112 kj/kg and 119 kj/kg. The specific heat capacity of the cooling liquid 50 is between 1183 J/kg·K and 1220 J/kg·K. The heat transfer rate of the cooling liquid 50 is between 0.069 W//M·K and 0.068 W//M·K. The surface tension of the cooling liquid 50 is 13.6 MN/M. It is noted that Kj, kg, J, K, W, M, and MN are international units of measurement, well known to one skilled in the art.

Figure 2:
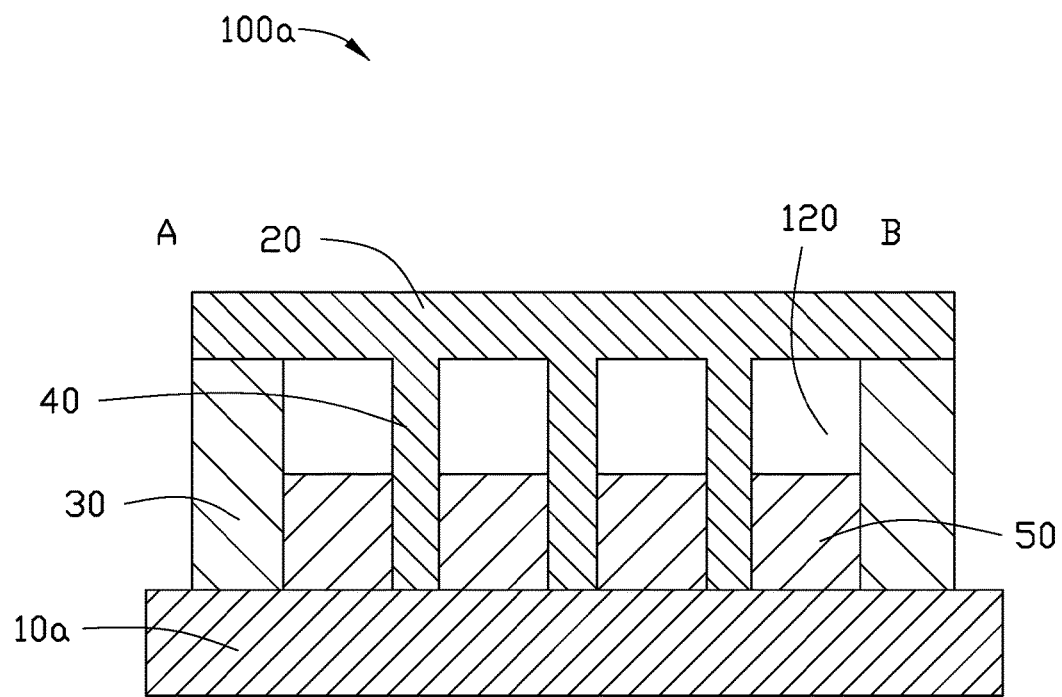
FIG. 2 is a cross-sectional view of a cooling plate of a second embodiment of the present disclosure.

Referring to FIG. 2, a cooling plate 100a of a second embodiment of the present disclosure is similar to the cooling plate 100 of the first embodiment. The cooling plate 100a includes a first plate 10a, a second plate 20 opposite to the first plate 10a, a bonding line 30 between the first plate 10a and the second plate 20, a plurality of supporting columns 40, and a cooling liquid 50 received in a cavity 120 between the first plate 10a and the second plate 20. The difference is that a first plate 10a of the cooling plate 100a is a portion of an electronic device, and the first plate 10a integrated with the electronic device.

Figure 3:
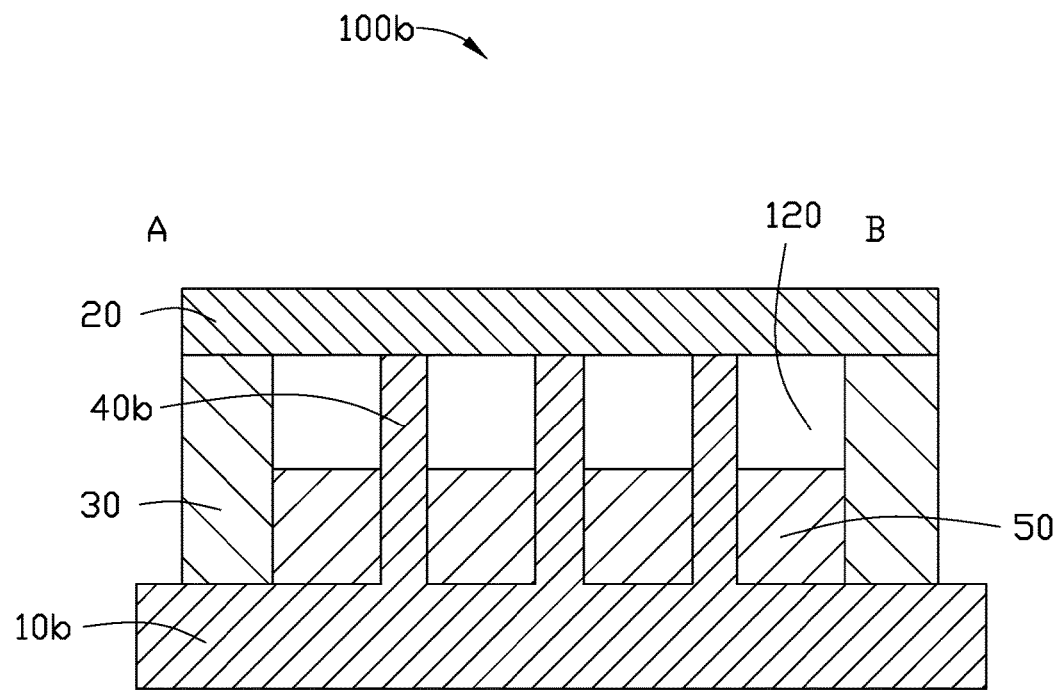
FIG. 3 is a cross-sectional view of a cooling plate of a third embodiment of the present disclosure.

Referring to FIG. 3, a cooling plate 100b of a third embodiment of the present disclosure is similar to the cooling plate 100 of the first embodiment. The cooling plate 100b includes a first plate 10b, a second plate 20 opposite to the first plate 10b, a bonding line 30 between the first plate 10b and the second plate 20, a plurality of supporting columns 40, and a cooling liquid 50 received in a cavity 120 between the first plate 10a and the second plate 20. The difference is that the first plate 10b and the plurality of supporting columns are a portion of a electronic device and integrated with the electronic device.

Figure 4:
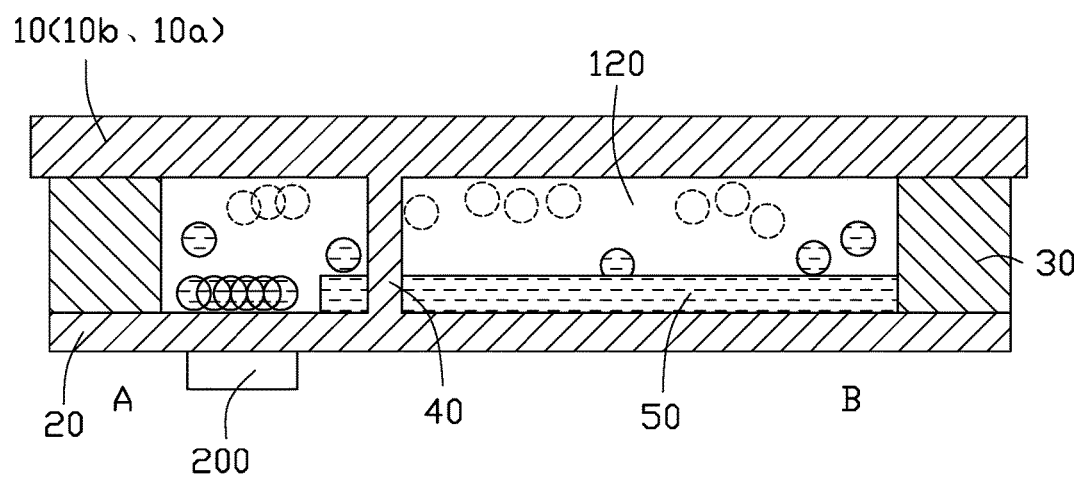
FIG. 4 is a diagram showing the working process of the cooling plate of the first embodiment of the present disclosure.

Referring to FIG. 4, while the cooling plate 100, 100a, 100b is working, the first end A of the cooling plate 10 contacts with a heat source 200. The cooling liquid 50 is evaporated from the first end A and condenses in the second end B. Specifically, the evaporated cooling liquid 50 flows in the cavity 120 along the first plate 10 (10a, 10b) from the first end A to the second end B. Thus, the cooling liquid 50 cycles constantly in the cavity 120 and transmit the heat from the heat source 200 to the first plate 10 (10a, 10b). Lastly, the heat is dissipated in the air by the first plate 10(10a, 10b).

The cooling plate 100, 100a, and 100b of the present application dissipates heat directly from the heat source 200 to the first plate 10, 10a and 10b, respectively, through the cooling liquid 50. Then, the heat is absorbed by the cooling plate 100, 100a, and 100b. Because the cooling plate 100, 100a, 100b have no need to mount a wick structure, so the cooling plate 100, 100a, 100b have a low cost. Further, the first plate 10a, 10b is integrated with the electronic device, so the heat can dissipate the heat from the heat source 200 to the electronic device. Thus, the cooling plate can be easily configured with the electronic device and has a higher cooling efficiency.

Figure 5:
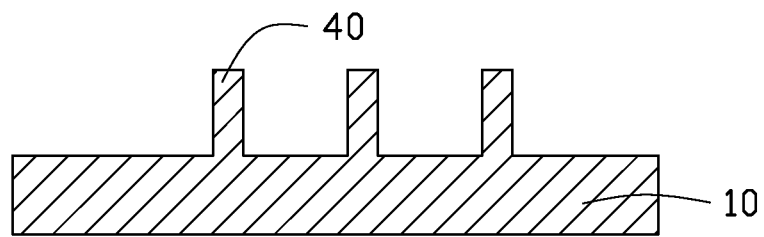
FIGS. 5-9 are diagrams of the method for manufacturing the cooling plate of the first embodiment.

Referring to FIGS. 5-9, a method for manufacturing the cooling plate 100 of the present disclosure includes the following steps:

Referring to FIG. 5, a first plate 10 is provided and a plurality of supporting columns 40 formed on the first plate 10.

Figure 6:
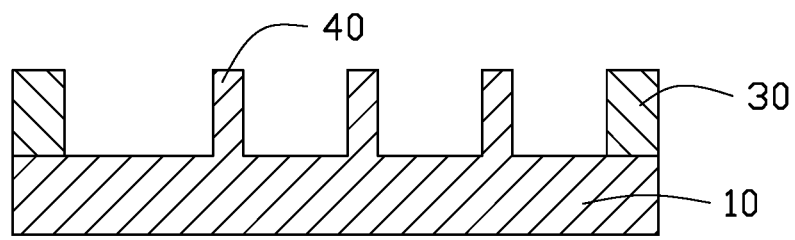

Referring to FIG. 6, a bonding line 30 is formed on the peripheries of the first plate 10.

Figure 7:
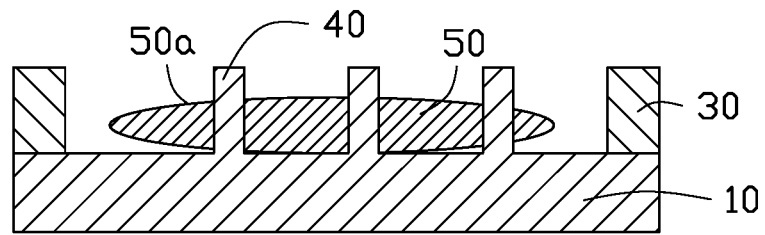

Referring to FIG. 7, a cooling bag 50a is provided on the first plate 10.

The cooling bag 50a has the cooling liquid 50 therein. The cooling bag 50a is soluble in the vacuum environment. The specific heat capacity of the cooling liquid 50 is between 1183 J/kg·K and 1220 J/kg·K. The heat transfer rate of the cooling liquid 50 is between 0.069 W//M·K and 0.068 W//M·K. The heat transfer rate of the cooling liquid 50 is between 0.069 W//M·K and 0.068 W//M·K. The surface tension of the cooling liquid 50 is 13.6 MN/M.

Figure 8:
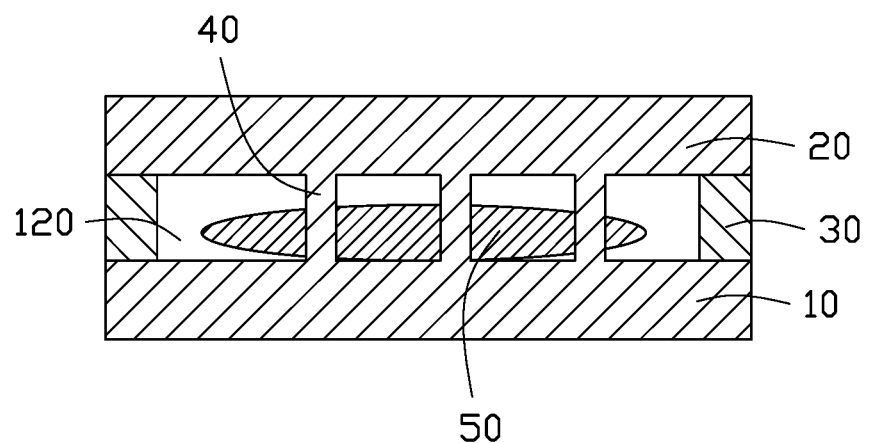

Referring to FIG. 8, a second plate 20 is provided and the second plate 20 is pressed on the bonding line 30, the first plate 10, the second plate 20 and the bonding line 30 together defining a cavity 120, then making the cavity 120 be a vacuum chamber.

Figure 9:
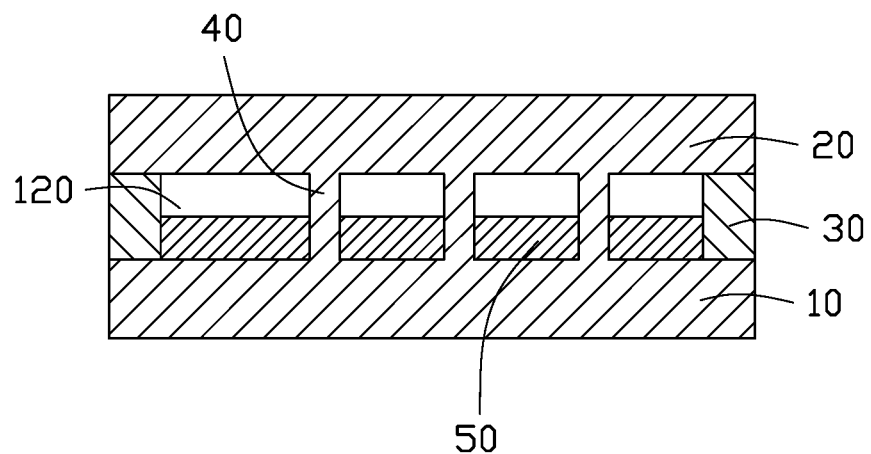

Referring to FIG. 8 and FIG. 9, the cooling bag 50a is dissolved, the cooling liquid 50 being receiving in the cavity 120. The cooling plate 100 is manufactured completely.

A method for manufacturing the cooling plate 10a, 10b is similar to the method for manufacturing the cooling plate 10, the difference is: the first plate 10a, 10b are integrated with a electronic device and are a portion of the electronic.

The embodiments shown and described above are only examples. Many details are often found in the art such as the other features of a cooling plate and method for manufacturing thereof. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A cooling plate configured with an electronic device for heat dissipation, the cooling plate comprising:
    a first plate;
    a second plate;
    a bonding line connecting between the first plate and the second plate;
    a plurality of supporting columns and a cooling liquid;
    wherein the first plate, the second plate, and the bonding line together define a cavity, the plurality of supporting columns and the cooling liquid are received in the cavity; and
    wherein the plurality of supporting columns connects perpendicularly with the first plate and the second plate, the cooling liquid communicates among the plurality of the supporting columns; the first plate and the plurality of supporting columns are integrated with the electronic device and are a portion of the electronic device.

2. The cooling plate of claim 1, wherein the vaporization heat of the cooling liquid is between 112 kj/kg and 119 kj/kg, the specific heat capacity of the cooling liquid is between 1183 J/kg·K and 1220 J/kg·K.

3. The cooling plate of claim 1, wherein the cooling plate has a first end A and a second end B, the first end A contacts with a heat source, the cooling liquid is evaporated through the cavity from the first end A and condensed in the second end B.

4. The cooling plate of claim 1, wherein the first plate is made of copper, the plurality of supporting columns is made of copper.

5. The cooling plate of claim 1, wherein the first plate is integrated with the electronic device and is a portion of the electronic device.

6. The cooling plate of claim 1, wherein the heat transfer rate of the cooling liquid is between 0.069 W//M·K and 0.068 W//M·K, the surface tension of the cooling liquid is 13.6 MN/M.

7. A method for manufacturing a cooling plate, comprising the following steps:
    providing a first plate and a plurality of supporting columns formed on the first plate;
    forming bonding lines on peripheries of the first plate;
    providing a cooling bag on the first plate, and the cooling bag having a cooling liquid therein;
    providing a second plate and pressing the second plate on the bonding lines, wherein the first plate, the second plate and the bonding lines together defining a cavity, then making the cavity a vacuum chamber; and
    dissolving the cooling bag, the cooling liquid being receiving in the cavity.

8. The method of claim 7, wherein the first plate and the plurality of supporting columns are made of copper.

9. The method of claim 7, wherein the first plate is integrated with an electronic device.

10. The method of claim 7, wherein the first plate and the plurality of supporting columns are integrated with an electronic device.

* * * * *